(12) United States Patent
He et al.

(10) Patent No.: US 9,892,921 B2
(45) Date of Patent: Feb. 13, 2018

(54) INTERCONNECT STRUCTURE AND METHOD FOR FORMING THE SAME

(71) Applicant: Semiconductor Manufacturing International (Shanghai) Corporation, Shanghai (CN)

(72) Inventors: Qiyang He, Shanghai (CN); Chenglong Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 316 days.

(21) Appl. No.: 14/583,878

(22) Filed: Dec. 29, 2014

(65) Prior Publication Data

US 2015/0187601 A1 Jul. 2, 2015

(30) Foreign Application Priority Data

Dec. 30, 2013 (CN) .......................... 2013 1 0746414

(51) Int. Cl.
| | |
|---|---|
| *H01L 21/3213* | (2006.01) |
| *H01L 21/225* | (2006.01) |
| *H01L 21/768* | (2006.01) |
| *H01L 21/311* | (2006.01) |

(52) U.S. Cl.
CPC .... *H01L 21/2257* (2013.01); *H01L 21/31116* (2013.01); *H01L 21/31144* (2013.01); *H01L 21/32134* (2013.01); *H01L 21/76816* (2013.01); *H01L 21/76897* (2013.01); *H01L 21/76895* (2013.01); *H01L 2924/0002* (2013.01)

(58) Field of Classification Search
CPC ............... H01L 21/2257; H01L 23/481; H01L 29/42364; H01L 21/76816; H01L 21/768; H01L 21/32139; H01L 21/0273
USPC .......................................... 257/754; 438/478
See application file for complete search history.

(56) References Cited

U.S. PATENT DOCUMENTS

2004/0021196 A1* 2/2004 Brennan ........... H01L 21/76813
257/508

* cited by examiner

*Primary Examiner* — Bo Fan
(74) *Attorney, Agent, or Firm* — Anova Law Group, PLLC

(57) ABSTRACT

Various embodiments provide semiconductor devices and methods for forming the same. A base including a substrate and an interlayer dielectric layer is provided. The base has a first region and a second region that have an overlapped third region. A mask layer having a stacked structure is formed on the interlayer dielectric layer at the overlapped third region. Using the mask layer as an etching mask, the interlayer dielectric layer at the first region at both sides of the mask layer is etched, to expose the substrate and form a first contact via at the first region. Using the mask layer as an etching mask, the interlayer dielectric layer at the second region at both sides of the mask layer is etched, to form a second contact via at the second region. A conductive layer is formed to fill the first contact via and the second contact via.

17 Claims, 12 Drawing Sheets

INTERCONNECT STRUCTURE AND METHOD FOR FORMING THE SAME

CROSS-REFERENCES TO RELATED APPLICATIONS

This application claims priority to Chinese Patent Application No. CN201310746414.4, filed on Dec. 30, 2013, the entire content of which is incorporated herein by reference.

FIELD OF THE DISCLOSURE

The present disclosure relates to the field of semiconductor manufacturing technology and, more particularly, relates to interconnect structures and methods for forming the same.

BACKGROUND

For semiconductor integrated circuit manufacturing, in order to increase density of devices, size of semiconductor devices in an integrated circuit such as transistor, resistor, capacitor or other existing semiconductor components has been continually reduced. Therefore, in order to electrically connect each semiconductor device, a multi-layer interconnect structure is often required.

In a back-end interconnection process during semiconductor device manufacturing, an electrical connection needs to be formed between a first metal layer (M1) and an active device structure in a lower layer (containing a source region, a drain region and a gate structure region). Therefore, before the first metal layer is formed, a local interconnect structure of a semiconductor device needs to be formed in advance. The local interconnect structure includes contact vias used for connecting the first metal layer with the source region, the drain region and the gate structure region. A zeroth metal layer (M0) is formed in the contact vias.

However, because the contact vias in the source region and the drain region often do not have the same depth as the contact via in the gate structure region, it becomes difficult to etch contact vias in different regions of the local interconnect structure and to deposit conductive material.

In order to solve the problem of unequal depths of the contact vias, existing process for forming an interconnect structure is often complicated, and production efficiency is often low. The disclosed methods and structures are directed to solve one or more problems set forth above and other problems.

BRIEF SUMMARY OF THE DISCLOSURE

One aspect of the present disclosure includes methods for forming an interconnect structure. In an exemplary method, a base including a substrate and an interlayer dielectric layer can be provided. The base can have a first region and a second region. The first region and the second region can have an overlapped third region. The interlayer dielectric layer at the second region can have a gate structure formed therein. A mask layer can be formed on the interlayer dielectric layer on the overlapped third region. The mask layer can have a stacked structure. Using the mask layer as an etching mask, the interlayer dielectric layer located at the first region at both sides of the mask layer can be etched, such that a surface of the substrate is exposed and a first contact via can be formed on the exposed surface of the substrate and in the interlayer dielectric layer at the first region. Using the mask layer as an etching mask, the interlayer dielectric layer at the second region at both sides of the mask layer can be etched, such that a top of the gate structure can be exposed, to form a second contact via in the interlayer dielectric layer at the second region. The mask layer can be used as an etching mask for forming both of the first contact via and the second contact via. A conductive layer can be formed to fill the first contact via and the second contact via.

Another aspect of the present disclosure includes semiconductor devices. An exemplary device can have an interconnect structure. The device can include a base. The base can include a substrate and an interlayer dielectric layer on the substrate. The base can have a first region and a second region. The first region and the second region can have an overlapped third region. The interlayer dielectric layer at the second region can have a gate structure therein. Further, the device can include a first contact via in the interlayer dielectric layer at the first region to expose a surface of the substrate. Further, the device can include a second contact via in the interlayer dielectric layer at the second region to expose a top of the gate structure. The first contact via and the second contact via can be formed using a process. The process can include forming a mask layer on the interlayer dielectric layer at the overlapped third region. The mask layer can have a stacked structure. Further, the process can include using the mask layer as an etching mask, etching the interlayer dielectric layer located at the first region on both sides of the mask layer, to form the first contact via. Further, the process can include using the mask layer as an etching mask, etching the interlayer dielectric layer at the second region at both sides of the mask layer, to form the second contact via. The mask layer can be used as an etching mask for forming both of the first contact via and the second contact via. Further, the device can include a conductive layer filling the first contact via and the second contact via.

Other aspects or embodiments of the present disclosure can be understood by those skilled in the art in light of the description, the claims, and the drawings of the present disclosure.

DETAILED DESCRIPTION

Figure 1:
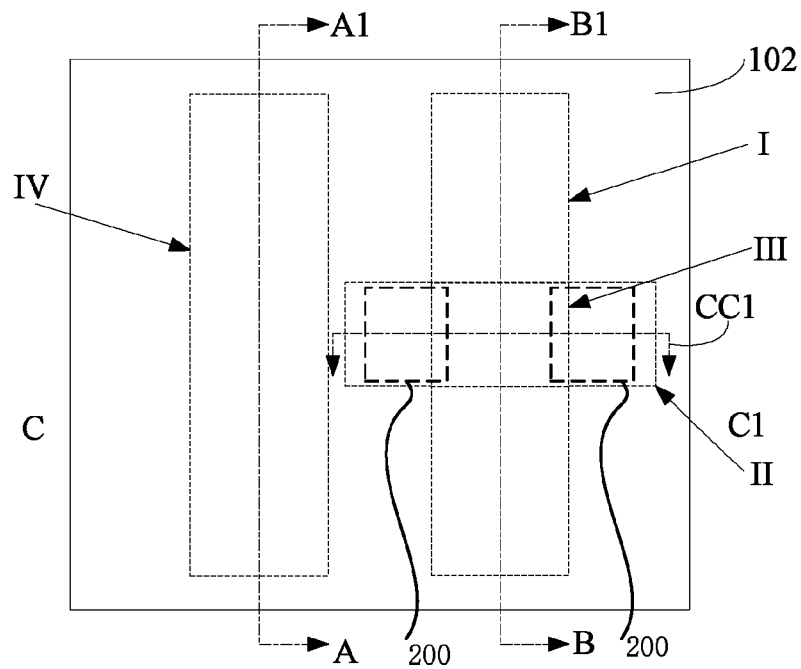
FIGS. 1-28 depict structures of an exemplary semiconductor device having an interconnect structure at various stages during a fabrication process in accordance with various disclosed embodiments.

Reference will now be made in detail to exemplary embodiments of the disclosure, which are illustrated in the accompanying drawings. Wherever possible, the same reference numbers will be used throughout the drawings to refer to the same or like parts.

In an interconnect structure, because a contact via in the source/drain region (i.e., source region, drain region, or both of source region and drain region) and a contact via in the gate structure have a height difference, it can be difficult to know or understand the etch stop time of the contact vias in the interconnect structure. If etching is stopped immediately when the gate structure is exposed by the bottom of the contact via located on the top of the gate structure, the surface of the source/drain region is not yet exposed by the bottom of the contact via at the source/drain region for a same transistor device. Thus, the source/drain region cannot be electrically connected to an upper metal layer. If etching is stopped after the surface of the source/drain region is exposed by the bottom of the contact via at the source/drain region, the contact via on the top of the gate structure may reach deep into interior of the gate structure to result in over-etching of the gate structure and failure of the final device.

To solve the problem of the height difference of the contact vias formed on the top of the source/drain region and the gate structure, and further to solve other problems, a method for forming an interconnect structure can include the following process. A substrate is provided. The substrate has a source/drain region. The source/drain region has a surface leveled with a surface of the substrate. A gate structure is on the surface of the substrate. An interlayer dielectric layer is formed on the surface of the substrate. The interlayer dielectric layer has a top higher than a top of the gate structure.

Further, a patterned first mask layer is formed on a surface of the interlayer dielectric layer. By using the first mask layer as an etching mask, the interlayer dielectric layer is etched to form a first contact via. A bottom of the first contact via exposes the surface of the source/drain region. A metal layer is formed at the bottom of the first contact via. The metal layer is silicided (i.e., undergoes a silicidation process) to form a metal silicide layer. The portion of the metal layer that has not been silicided is removed. At the same time, the first mask layer is removed.

Further, a patterned second mask layer is formed on the surface of the interlayer dielectric layer. By using the second mask layer as an etching mask, the interlayer dielectric layer is etched to form a second contact via. A bottom of the second contact via exposes the top of the gate structure. The second mask layer is removed. A conductive layer is formed to substantially fill the first contact via and the second contact via.

However, the method for forming the interconnection structure as provided above requires forming a patterned mask layer twice. Thus, process difficulty and process complexity is increased. In addition, for a device having a relatively small feature size, increasing the number of patterned mask layers may cause a deviation in the position for subsequently forming the second contact via, and cause failure of performance of the interconnect structure. As a result, reliability and electrical properties of the interconnect structure may be affected.

Further studies on the method for forming an interconnect structure find that, the first mask layer and the second mask layer can have a mutually overlapped position. The first contact via can have a greater depth than the second contact via. Thus, the first mask layer for forming the first contact via can have a greater thickness than the second mask layer for forming the second contact via. When a stacked mask layer is formed on the overlapped position, the stacked mask layer and a first photoresist layer can be used as a mask to form the first contact via.

At the same time of removing the portion of the metal layer that has not been silicided, a thickness portion of the mask layer can be removed. The remaining mask layer and a second photoresist layer can be used as a mask to form a second contact via. Thus, process steps can be reduced and production efficiency can be improved. In addition, the position of the mask layer and the remaining mask layer can be unchanged, to prevent the position of the second contact via from deviating from the designed target (or designed position). Thus, reliability of the interconnect structure can be improved.

Thus, various embodiments provide a method for forming an interconnect structure. In an exemplary method, a base is provided. The base includes a substrate and an interlayer dielectric layer on the substrate. The base has a first region and a second region. The first region and the second region have an overlapped third region. A mask layer having a stacked structure can be formed on a surface of the third region. By using the mask layer as a mask, an interlayer dielectric layer at the first region at both sides of the mask layer can be etched, until the surface of the substrate is exposed, to form a first contact via. A first metal silicide layer can be formed on the bottom of the first contact via. The portion of the metal layer that has not had the silicidation reaction can be removed and, at the same time, a thickness portion of the mask layer can be removed.

Further, by using the remaining mask layer as a mask, the interlayer dielectric layer at the second region at both sides of the mask layer can be etched, until the top of the gate structure is exposed, to form a second contact via. A conductive layer can be formed to substantially completely fill the first contact via and the second contact via. By using the method as disclosed herein, process steps for forming mask layers can be reduced, and the process for forming an interconnect structure can be optimized. Further, the probability of the second contact via deviating from the design target can be reduced. Thus, reliability and electrical properties of the formed interconnect structure can be improved.

Figure 28:
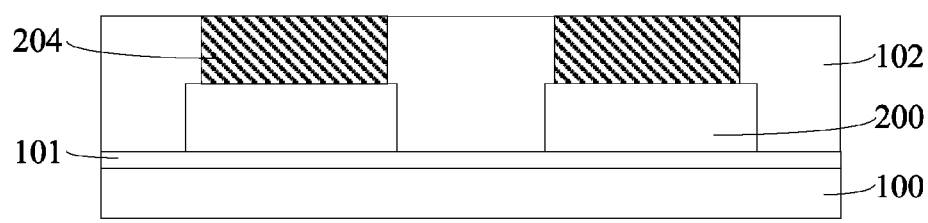
Figure 29:
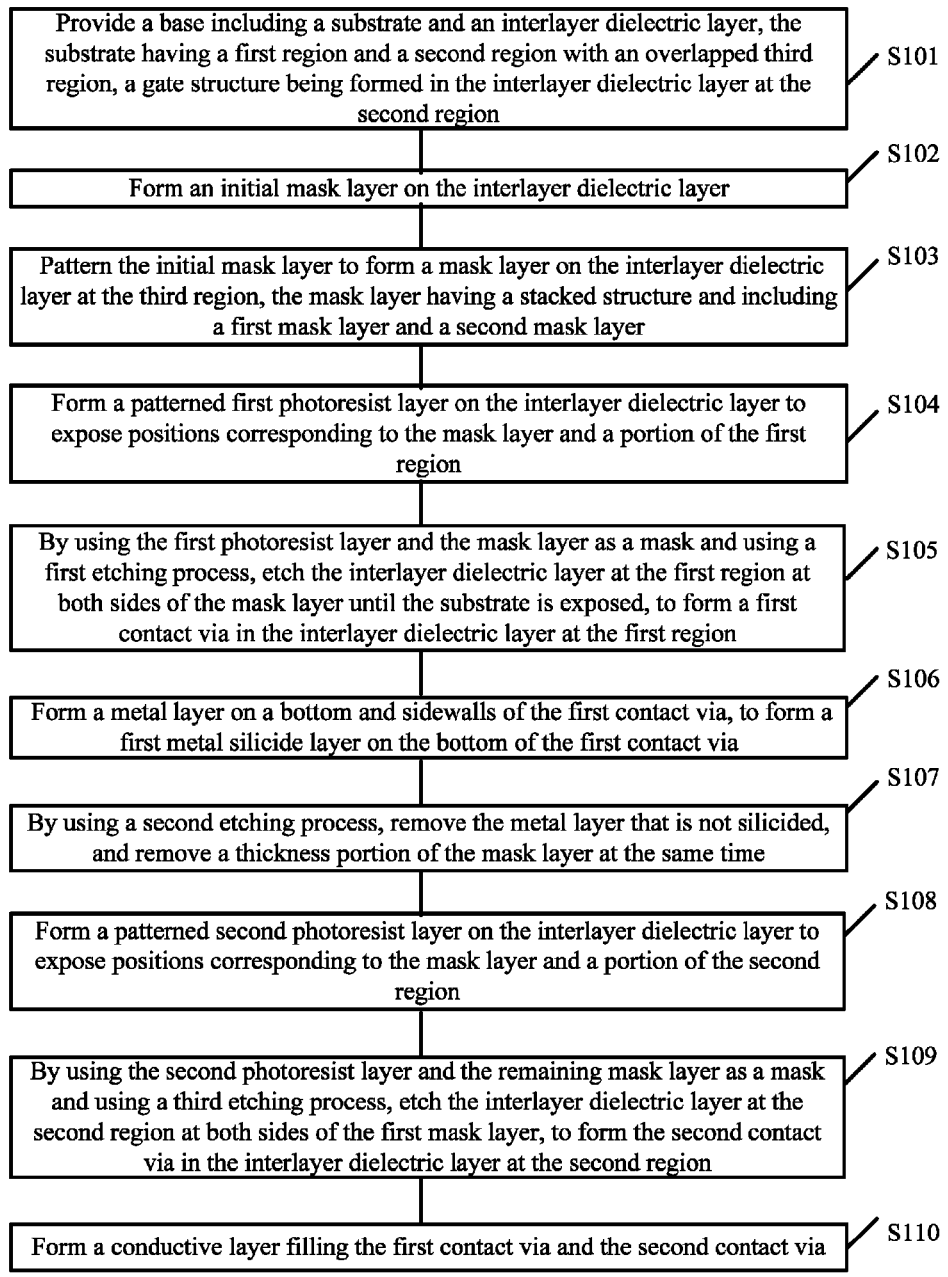
FIG. 29 depicts a flow diagram of an exemplary method for forming an interconnect structure in accordance with various disclosed embodiments.

FIG. 29 depicts a flow diagram of an exemplary method for forming an interconnect structure in accordance with various disclosed embodiments. FIGS. 1-28 depict structures of the interconnect structure at various stages during a fabrication process in accordance with various disclosed embodiments. Note that although FIGS. 1-28 depict semiconductor structures corresponding to the method depicted in FIG. 29, the semiconductor structures and the method are not limited to one another in any manner.

Figure 2:
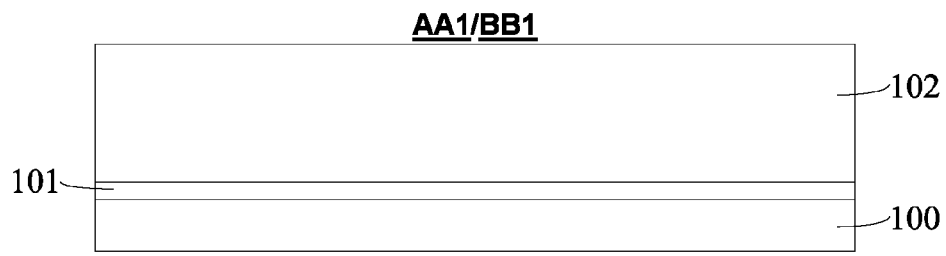
Figure 3:
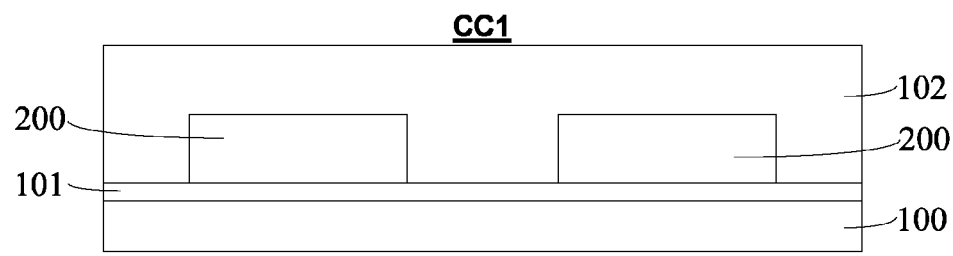

In Step S101 of FIG. 29, a base is provided. FIGS. 1-3 depict a corresponding structure. FIG. 1 depicts a top view of the structure. FIG. 2 depicts a cross-sectional view of the structure in an AA1 direction or a BB1 direction in FIG. 1. FIG. 3 depicts a cross-sectional view of the structure in a CC1 direction in FIG. 1. The base can include a substrate 100 and an interlayer dielectric layer 102. The substrate has a first region I and a second region II. The first region I and the second region II can have an overlapped third region III. A gate structure 200 can be formed in the interlayer dielectric layer 102 at the second region II.

In one embodiment, the first region I can be a region for a first contact via to be formed. The substrate 100 at the first region I has a source/drain region formed therein. A conductive layer can be subsequently formed on the surface of the source/drain region in order to achieve electrical interconnection. The second region II can be a region for a second contact via to be formed. The conductive layer can be subsequently formed on a top of the gate structure in order to achieve electrical interconnection.

The substrate 100 can be made of a material including monocrystalline silicon, polycrystalline silicon, amorphous silicon, and/or silicon-on-insulator. The substrate 100 can include a Si substrate, a Ge substrate, a SiGe substrate or a GaAs substrate. A plurality of epitaxial interface layers or strained layers can be formed on the surface of the substrate 100 to improve electrical performance of the semiconductor device. Semiconductor device(s) can be formed in the substrate 100. The semiconductor device can include a metal-oxide-semiconductor (MOS) transistor, a capacitor, a resistor, and/or a fin field effect transistor (FinFET).

The interlayer dielectric layer 102 can be made of a material including silicon dioxide, a low-k dielectric material, or an ultra-low-k dielectric material. In certain embodiments, a low-k dielectric material refers to a dielectric material having a relative permittivity (or dielectric constant) less than about 3.9, and an ultra-low-k dielectric material refers to a dielectric material having a relative permittivity less than about 2.5. When the low-k dielectric material or the ultra-low-k dielectric material is used as the material of the interlayer dielectric layer 102, to a certain extent, the relative permittivity of the semiconductor device can be reduced, RC delay effect can be improved, and operating speed of the semiconductor device may be improved.

The low-k dielectric material can include SiCOH, FSG (i.e., fluorosilicate glass or fluorine-doped silicon dioxide), BSG (i.e., borosilicate glass or boron-doped silicon dioxide), PSG (i.e., phosphosilicate glass or phosphorus-doped silicon dioxide), and/or BPSG (i.e., borophosphosilicate glass or boron-and-phosphorous-doped silicon dioxide).

The gate structure 200 can include a gate dielectric layer and a gate conductive layer on the surface of the gate dielectric layer. The gate dielectric layer can be made of a material including silicon oxide or a high-k dielectric material. The gate conductive layer can be made of a material including polysilicon or a conductive metal.

In one embodiment, the substrate 100 can include a Si substrate. The interlayer dielectric layer 102 can be made of a material including $SiO_2$.

The substrate 100 and the interlayer dielectric layer 102 can have an etch stop layer 101 formed there-between. In some embodiments, the etch stop layer 101 can be made of a material including SiC. In other embodiments of the present disclosure, the etch stop layer 101 can be made of a material including SiN, SiON, and/or SiCN.

In one embodiment, the base can further include a fourth region IV as shown in FIG. 1. The fourth region IV can be a region for a third contact via to be formed. Further, the third contact via can have a depth substantially equal to the depth of the first contact via.

Figure 4:
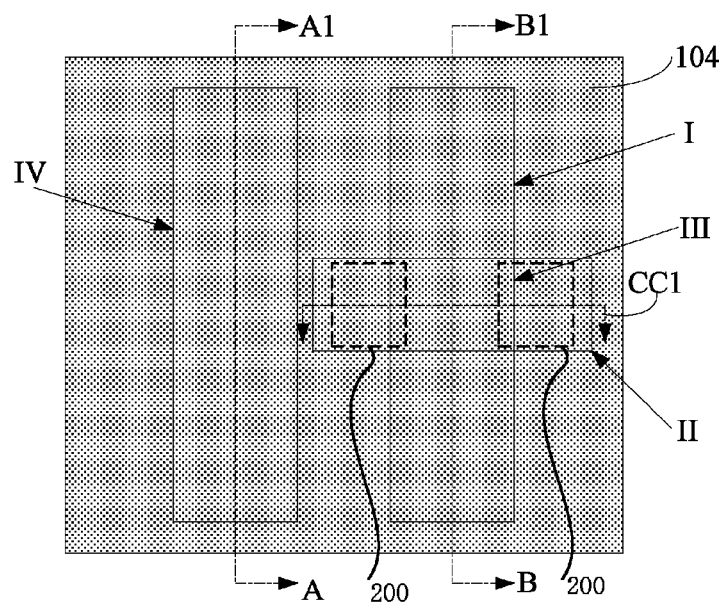
Figure 5:
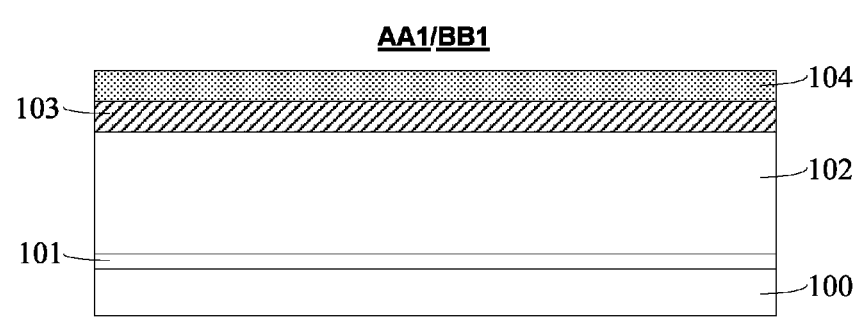
Figure 6:
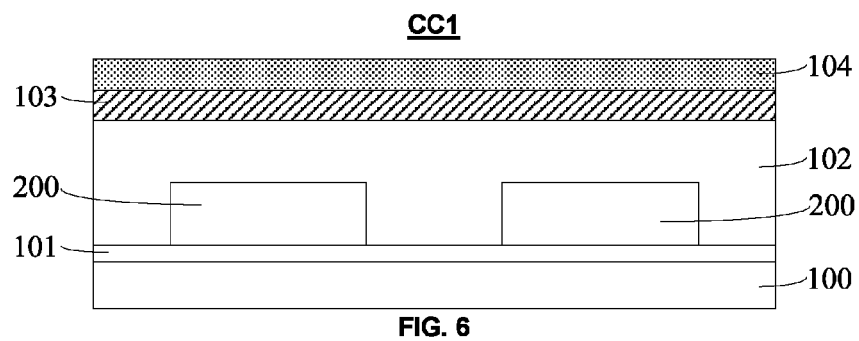

In Step S102 of FIG. 29, an initial mask layer having a stacked structure is formed on the surface of the interlayer dielectric layer 102. FIGS. 4-6 depict a corresponding structure. FIG. 4 depicts a top view of the structure. FIG. 5 depicts a cross-sectional view of the structure in an AA1 direction or a BB1 direction in FIG. 4. FIG. 6 depicts a cross-sectional view of the structure in a CC1 direction in FIG. 4.

In one embodiment, the stacked structure can include a two-layer structure including first and second mask layers made from an initial mask layer. The initial mask layer can include a first initial mask layer 103 and a second initial mask layer 104 on the surface of the first initial mask layer 103.

One or both of the first initial mask layer 103 and the second initial mask layer 104 can be made of a material including TiN, TaN, and/or SiN. The material of the first initial mask layer 103 may be the same as or different from the material of the second initial mask layer 104.

The first initial mask layer 103 can be used for subsequently forming the first mask layer. The second initial mask layer 104 can be used for subsequently forming the second mask layer.

For subsequent removing of a thickness portion of the stacked structure including the first and second mask layers, an etching selectivity between the first and second mask layers may be sufficiently high in order to prevent the mask layer from being completely removed, as desired. In certain embodiments, 'removing a thickness portion of a layer' can refer to removing an upper portion of the layer, and the upper portion has a thickness less than the thickness of the layer that is prior to the removing.

Thus, in one embodiment, the material of the first initial mask layer 103 (corresponding to the first mask layer) can be different from the material of the second initial mask layer 104 (corresponding to the second mask layer). In that case, a subsequent etching process can have different etching rates for the first mask layer and the second mask layer. Thus, removing a thickness portion of the mask layer may be easily achieved.

A subsequent wet etching process can have a high etching rate for a material having a metallic property. Further, a subsequent process can remove the second mask layer by etching and retain the first mask layer. Therefore, in one embodiment, the first initial mask layer 103 can be made of a material including SiN, and the second initial mask layer 104 can be made of a material including TiN and/or TaN.

In Step S103 of FIG. 29, the initial mask layer is patterned, to form a mask layer having a stacked structure on the surface of the interlayer dielectric layer 102 at the third region III. The mask layer can include a first mask layer 113 and a second mask layer 114.

Figure 7:
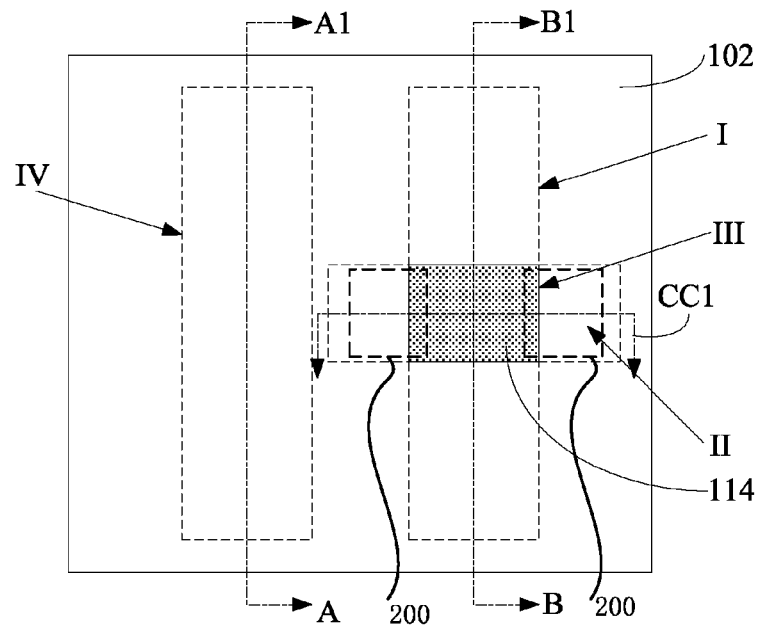
Figure 7A:
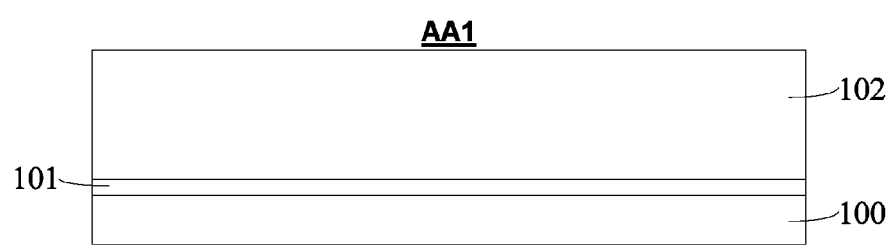
Figure 8:
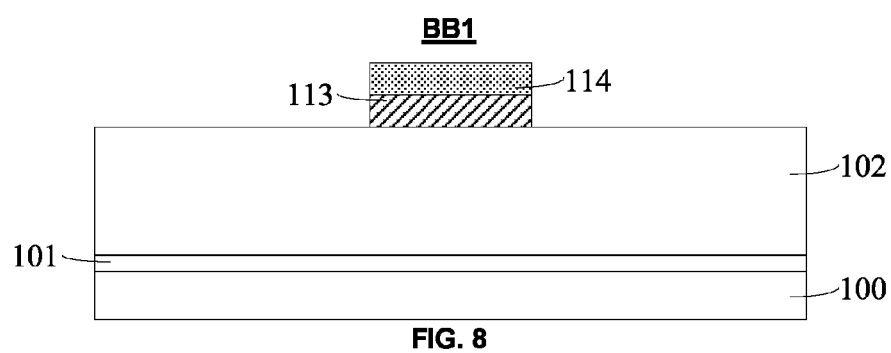
Figure 9:
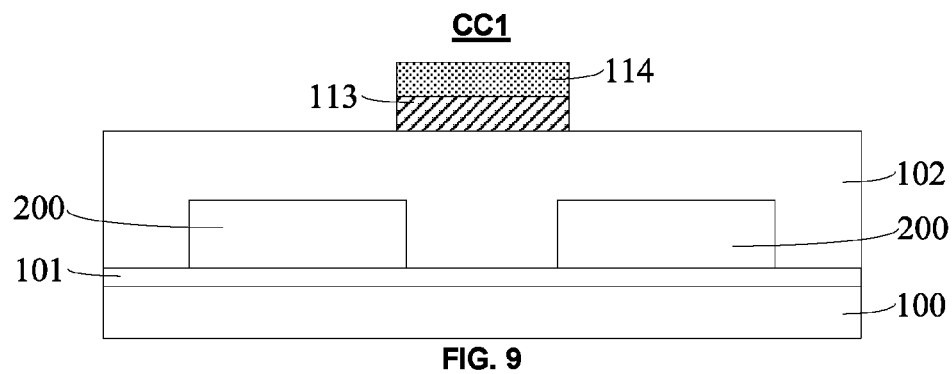

FIGS. 7-9 depict a corresponding structure. FIG. 7 depicts a top view of the structure. FIG. 8 depicts a cross-sectional view of the structure in a BB1 direction in FIG. 7. FIG. 9 depicts a cross-sectional view of the structure in a CC1 direction in FIG. 7. A cross-sectional view of the structure in an AA1 direction in FIG. 7 can be the same as or similar to FIG. 2, as shown in FIG. 7A.

In one embodiment, a process for forming the mask layer can include the following exemplary steps. A patterned photoresist layer can be formed on the surface of the initial mask layer. The patterned photoresist layer can be located on the surface of the interlayer dielectric layer 102 at the third region III. The initial mask layer can be etched using the patterned photoresist layer as a mask, to form the mask layer on the surface of the interlayer dielectric layer 102 at the third region III. The mask layer can include the first mask layer 113 and the second mask layer 114 on the surface of the first mask layer 113.

In one embodiment, the first mask layer 113 and the second mask layer 114 can be formed by photolithography and etching processes. In another embodiment of the present disclosure, the first mask layer 113 and the second mask layer 114 may be formed by one or more processes of nano-imprint lithography and nano-injection lithography (NIL).

One or both of the first mask layer 113 and the second mask layer 114 can be made of a material including TiN, TaN, and/or SiN. In one embodiment, the first mask layer 113 can be made of a material including SiN, and the second mask material layer 114 can be made of a material including TiN and/or TaN.

In certain embodiments, the benefit of using SiN as the material of the first mask layer 113 and using TiN or TaN as the material of the second mask layer 114 can include the following. After a first metal silicide and a second metal silicide are subsequently formed, a metal layer that has not been silicided (i.e., has not undergone the silicidation process) can be removed using a wet etching process. The wet etching process can also remove a thickness portion of the mask layer by etching. When the material of the second mask layer 114 is TiN or TaN and the material of the first mask layer 113 is SiN, the wet etching process can have a high etching rate for the second mask layer 114 and a low etching rate for the first mask layer 113, to prevent the mask layer from being completely removed after the wet etching process.

The first mask layer 113 and the second mask layer 114 may be used as a mask for forming the first contact via at the first region I, and may be used as a mask for forming the second contact via at the second region II.

In Step S104 of FIG. 29, a first anti-reflective coating 105 and a patterned first photoresist layer 106 are sequentially formed on the surface of the interlayer dielectric layer 102 and the mask layer at the first region I. The first anti-reflective coating 105 can also cover the surface of the interlayer dielectric layer 102 at the second region II and the fourth region IV.

Figure 10:
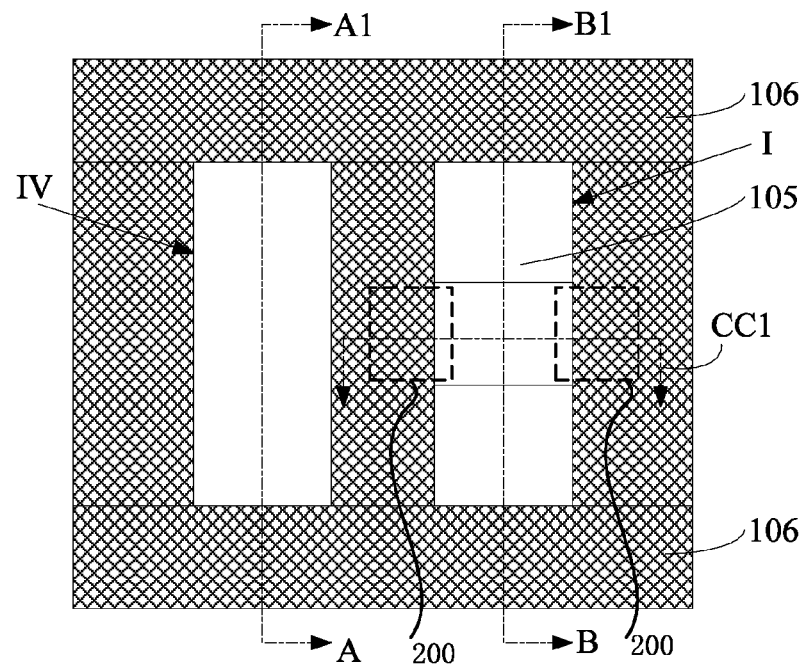
Figure 11:
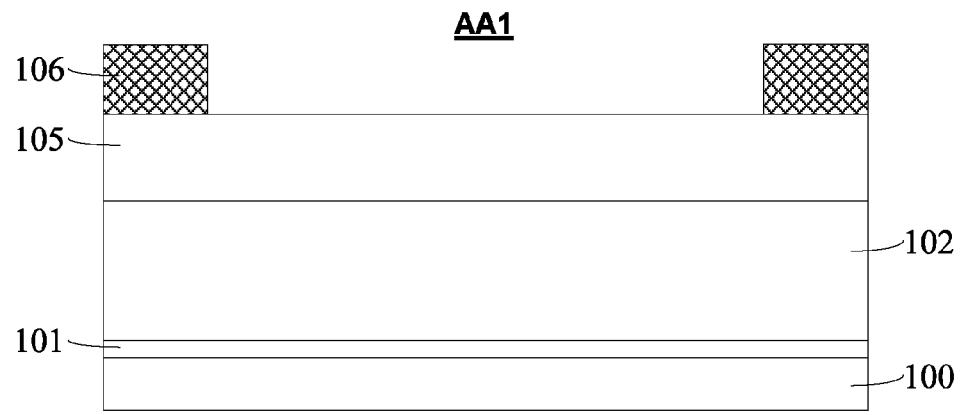
Figure 12:
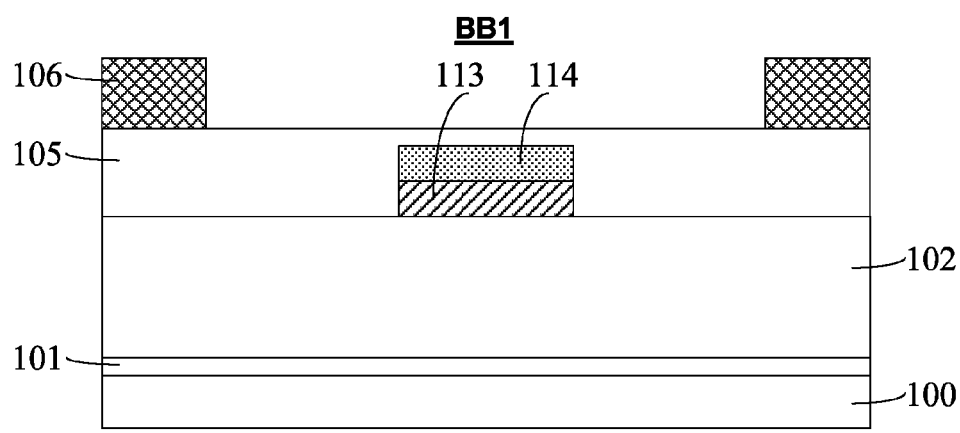
Figure 13A:
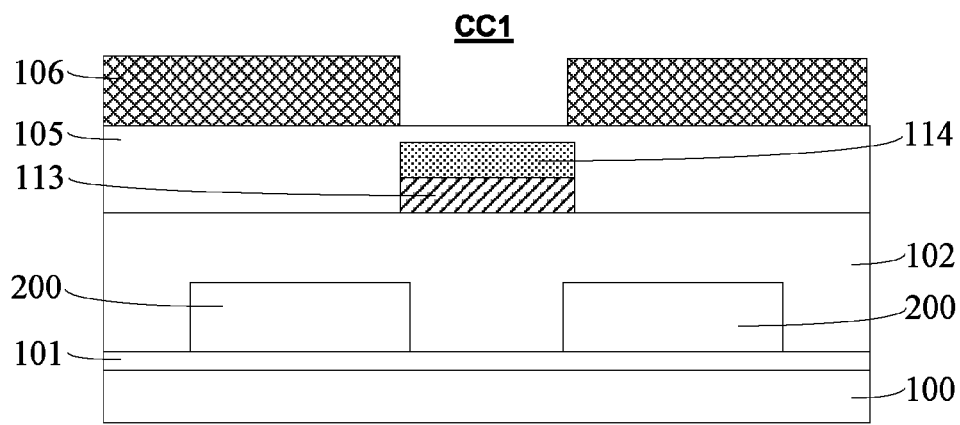

FIGS. 10-13A depict a corresponding structure. FIG. 10 depicts a top view of the structure. FIG. 11 depicts a cross-sectional view of the structure in an AA1 direction in FIG. 10. FIG. 12 depicts a cross-sectional view of the structure in a BB1 direction in FIG. 10. FIG. 13A depicts a cross-sectional view of the structure in a CC1 direction in FIG. 10.

Requirements for position of the first photoresist layer 106 can be as follows. The first photoresist layer 106 can cover a portion of the first region I and expose a position corresponding to a surface of the source/drain region in the substrate 100 at the first region I. By using the first photoresist layer 106 and the mask layer as a mask, the first region I can subsequently be etched to form the first contact via, and the formed first contact via can expose the surface of the source/drain region in the substrate 100. The first photoresist layer 106 can cover a portion the fourth region IV and expose a position for forming the third contact via at the fourth region IV. The first photoresist layer 106 can cover the second region II outside of the third region III, to protect the interlayer dielectric layer 102 from being damaged by a subsequent process for forming the first contact via.

Figure 13B:
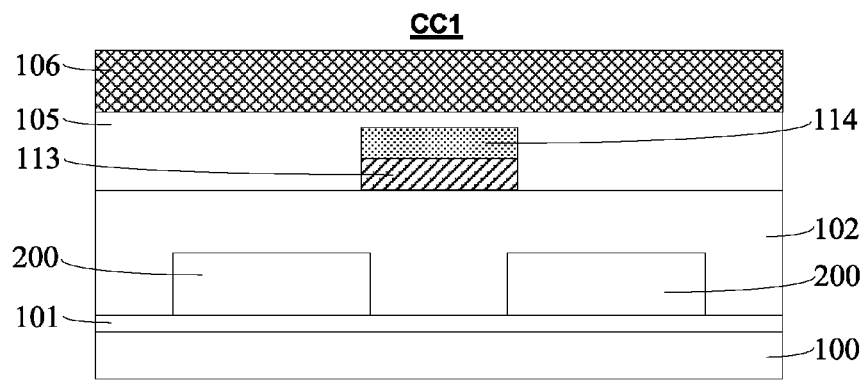

In one embodiment, as shown in FIG. 13A, the first photoresist layer 106 can substantially expose the third region III entirely, such that the mask layer can be used as a mask during a subsequent first etching process. However, in certain other embodiments, the first photoresist layer 106 does not need to expose the third region III entirely. Instead, the first photoresist layer 106 can cover a portion of the third region III. For example, the first photoresist layer 106 can cover a center portion of the third region III and expose portions corresponding to edges of the mask layer at the boundary between the third region III and the first region I. Thus, in this case, the mask layer can still be used as a mask during the subsequent first etching process. For illustrative purposes, as shown in FIG. 13B, the first photoresist layer 106 can extend across the third region III in the BB1 direction in FIG. 10, to connect the first photoresist layer 106 that covers the second region II at both sides of the third region III.

In one embodiment, a process for forming the first photoresist layer 106 can include the following exemplary steps. An initial photoresist layer can be formed on the surface of the first anti-reflective coating 105. The initial photoresist layer can be exposed and developed, to remove the portion of the initial photoresist layer at the region(s) for forming the first contact via and the third contact via, and thus to form the first photoresist layer 106.

The first anti-reflective coating 105 can have effects including reducing intensity of reflected light at the bottom of the initial photoresist layer, to improve quality of the pattern formed in the first photoresist layer 106. The first anti-reflective coating 105 can further prevent the first photoresist layer 106 from directly contacting the interlayer dielectric layer 102, and thus prevent the process for forming the first photoresist layer 106 from damaging the interlayer dielectric layer 102. In certain other embodiments, the first photoresist layer may be formed directly on the surface of the interlayer dielectric layer 102.

In Step S105 of FIG. 29, by using the first photoresist layer 106 (referring to FIG. 12) and the mask layer as a mask and using a first etching process, the interlayer dielectric layer 102 located at the first region I on both sides of the mask layer is etched, until the surface of the substrate 100 is exposed. A first contact via 108 can thus be formed in the interlayer dielectric layer 102 at the first region I.

Figure 14:
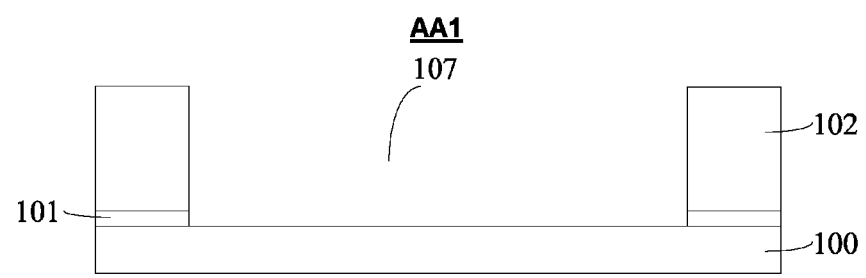
Figure 15:
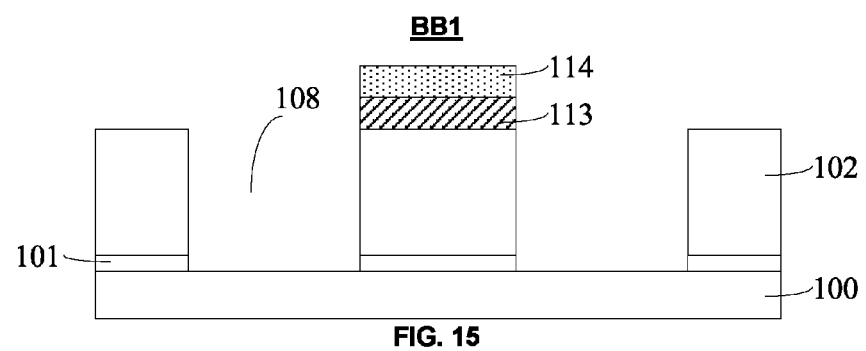

FIGS. 14-15 depict a corresponding structure. FIG. 14 depicts the corresponding structure based on FIG. 11. That is, FIG. 14 depicts a cross-sectional view of the structure in an AA1 direction in FIG. 10 after Step S105 is performed. FIG. 15 depicts the corresponding structure based on FIG. 12. That is, FIG. 15 depicts a cross-sectional view of the structure in a BB1 direction in FIG. 10 after Step S105 is performed.

The first contact via 108 can expose the surface of the source/drain region in the substrate 100 at the first region I.

In one embodiment, before the interlayer dielectric layer 102 is etched, the following process can be further included. The first anti-reflective coating 105 that is not covered by the first photoresist layer 106 can be removed by etching.

Because the first contact via 108 and the third contact via 107 can have the same depth, the first contact via 108 and the third contact via 107 can be formed in the same process, using the first etching process and using both of the first photoresist layer 106 and the mask layer as an etching mask layer. The first photoresist layer 106 for forming the first contact via 108 and the third contact via 107 can have the same thickness. The mask layer for forming the first contact via 108 and the third contact via 107 can have the same thickness.

That is, at the same time of forming the first contact via 108, by using the first photoresist layer 106 (referring to FIG. 11) as an etching mask, the interlayer dielectric layer 102 at the fourth region IV can be etched using the first etching process, until the surface of the substrate 100 is exposed. The third contact via 107 can thus be formed in the interlayer dielectric layer 102 at the fourth region IV.

The first etching process can include dry etching. The first etching process can use an etching gas that has a high etching rate for the interlayer dielectric layer 102 and a low etching rate for the second mask layer 114. In one embodiment, the first etching process can have an etching gas including $C_4F_8$, $C_5F_8$, or $CH_2F_2$.

In one embodiment, the first etching process can include plasma etching. The plasma etching can have the following process parameters. The plasma etching can have an etching gas including $C_4F_8$ and $C_5F_8$, a total flow rate of the etching gas ranging from about 50 sccm to about 500 sccm, an etching chamber pressure ranging from about 10 mTorr to about 50 mTorr, a source power ranging from about 1000 watts to about 3000 watts, and a bias power ranging from about 2000 watts to about 4000 watts.

During the first etching process, both of the first photoresist layer 106 and the mask layer at the second region II can protect the interlayer dielectric layer 102 at the second region II, to prevent the interlayer dielectric layer 102 at the second region II from being damaged by etching.

After the first contact via 108 and the third contact via 107 are formed, the first photoresist layer 106 and the first anti-reflective coating 105 can be removed. In one embodiment, the first photoresist layer 106 and the first anti-reflective coating 105 can be removed using an ashing process. The ashing process can include an ashing gas of $O_2$, an $O_2$ flow rate ranging from about 10 sccm to about 200 sccm, and an ashing temperature ranging from about 100 degrees to about 350 degrees.

In one embodiment, a process for forming the first contact via 108 and the third contact via 107 can include photolithography followed by etching. In other embodiments, the first contact via 108 and the third contact via 107 can be formed by one or more processes of nano-imprint lithography and nano-injection lithography (NIL).

In Step S106 of FIG. 29, a metal layer is formed on a bottom and sidewall(s) of the first contact via 108. A silicidation process can be performed on the metal layer, to form a first metal silicide layer 109 on the bottom of the first contact via 108.

Figure 16:
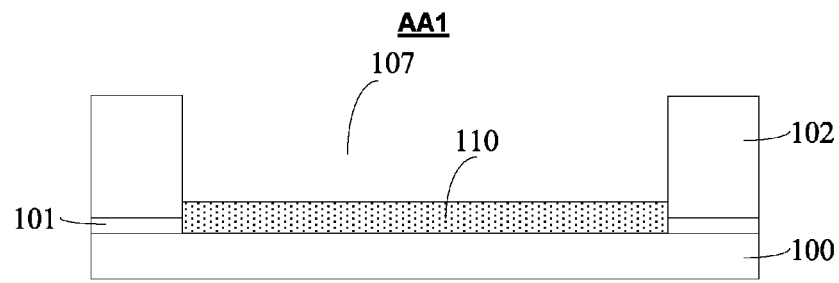
Figure 17:
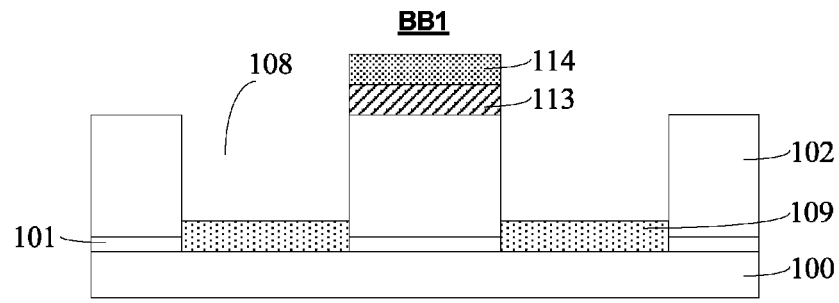

FIGS. 16-17 depict a corresponding structure. FIG. 16 depicts the corresponding structure based on FIG. 14. That is, FIG. 16 depicts a cross-sectional view of the structure in FIG. 14 after Step S106 is performed. FIG. 17 depicts the corresponding structure based on FIG. 15. That is, FIG. 17 depicts a cross-sectional view of the structure in FIG. 15 after Step S106 is performed.

In one embodiment, at the same time of forming the first metal silicide layer 109 on the bottom of the first contact via 108, a second metal silicide layer 110 can be formed on the bottom of the third contact via 107.

The first metal silicide layer 109 and the second metal silicide layer 110 can have effects including reducing a contact resistance of the source/drain region of the device in the interconnect structure and thus increasing operating speed of the interconnect structure.

In certain other embodiments, the first metal silicide layer 109 and the second metal silicide layer 110 is not formed or removed. Accordingly, in that case, the metal layer does not need to be formed or silicided. Further, in that case, a subsequent etching process (i.e., a second etching process) does not need to be performed to remove the metal layer, and thus the mask layer is not partially removed by the second etching process.

For example, the metal layer can be made of a material including Ni, Ti and/or Ta, and can be formed using a sputtering process. The silicidation process can include an annealing process. In a high temperature atmosphere, the material of the metal layer can have a chemical reaction with the material of the substrate, such that the material of the metal layer can be silicided, to form the first metal silicide layer 109 and the second metal silicide layer 110. Because sidewall(s) of the first contact via 108 and the third contact via 107 do not have silicon material, the metal layer on the sidewall(s) of the first contact via 108 and the third contact via 107 does not have the silicidation reaction.

The annealing process can include millisecond annealing, immersion annealing, and/or spike annealing. In one embodiment, the annealing process can include millisecond annealing. The millisecond annealing can have process parameters including an annealing temperature ranging from about 350 degrees to about 600 degrees, and an annealing duration ranging from about 0.02 millisecond to about 10 milliseconds.

In one embodiment, the substrate 100 can be made of a material including Si. Thus, in that case, the first metal silicide layer 109 and the second metal silicide layer 110 can be made of a material including NiSi, TiSi, and/or TaSi.

Figure 18:
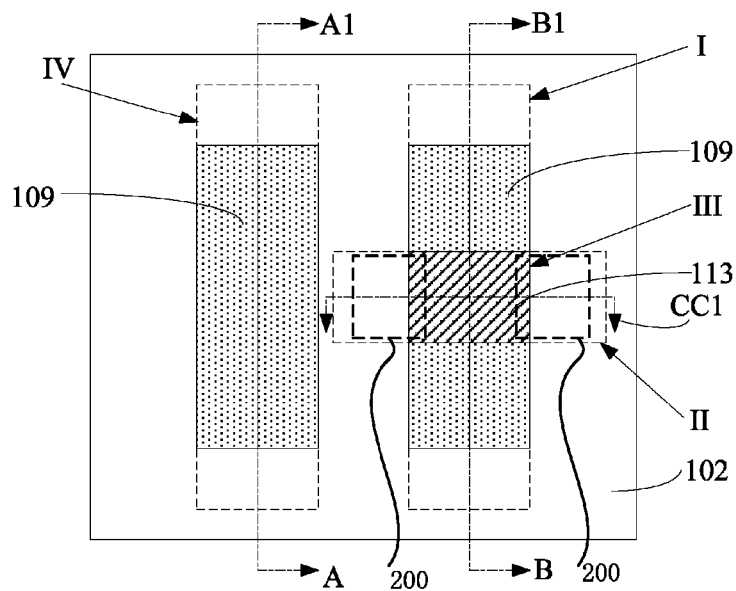
Figure 19:
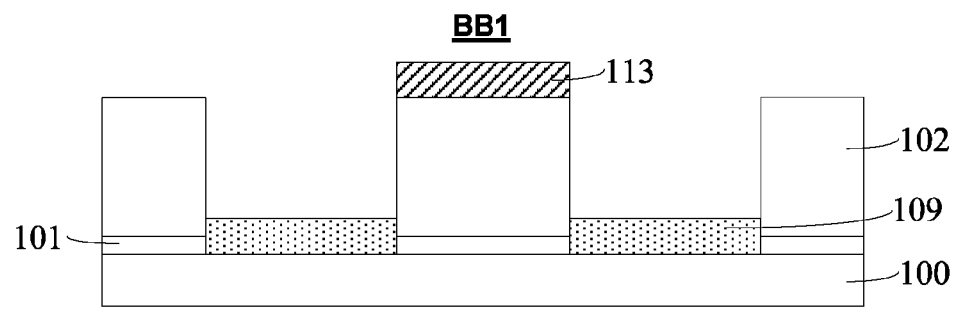
Figure 20:
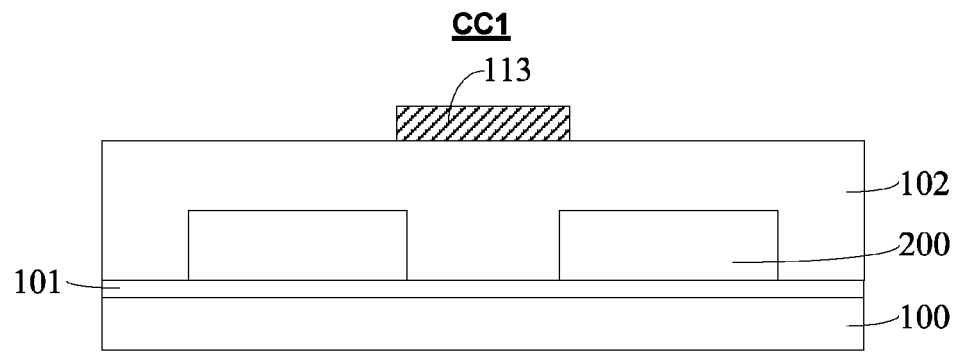

In Step S107 of FIG. 29, using a second etching process, the metal layer that has not had the silicidation reaction is removed, and a thickness portion of the mask layer is removed at the same time. FIGS. 18-20 depict a corresponding structure. FIG. 18 depicts a top view of the structure. FIG. 19 depicts a cross-sectional view of the structure in a BB1 direction in FIG. 18. FIG. 20 depicts a cross-sectional view of the structure in a CC1 direction in FIG. 18.

In one embodiment, the mask layer can include a two-layer structure. The mask layer can include the first mask layer 113 and the second mask layer 114 on the surface of the first mask layer 113 (referring to FIG. 17). Thus, the method for removing a thickness portion of the mask layer can include removing the second mask layer 114.

The second etching process can include wet etching. In one embodiment, the wet etching process can have an etching liquid including a hydrofluoric acid solution. The hydrofluoric acid solution can have a volume ratio of hydrofluoric acid to deionized water ranging from about 1:300 to about 1:700.

Because the second mask layer 114 can be made of a material including TiN and/or TaN, the hydrofluoric acid solution can have a high etching rate for the second mask layer 114 and a low etching rate for the first mask layer 113. Thus, at the same time of removing the metal layer that has not had the silicidation reaction, the second etching process can have an obvious (i.e., clear or apparent) etch stop position. The second mask layer 114 can be removed, and the first mask layer 113 can be retained. Thus, process difficulty of the second etching process can be reduced. The retained first mask layer 113 can be used as a mask for subsequently forming the second contact via.

In other embodiments of the present disclosure, when the first mask layer 113 and the second mask layer 114 are made of the same material, a process for removing a thickness portion of the mask layer can include one or more of the following exemplary steps. That is, a thickness portion of the second mask layer 114 can be removed, or the second mask layer 114 can be entirely removed, or the entire second mask layer 114 and a thickness portion of first mask layer 113 can be removed.

In Step S108 of FIG. 29, a second anti-reflective coating 201 and a patterned second photoresist layer 202 are sequentially formed on the surface of the interlayer dielectric layer 102 and the first mask layer 113 at the second region II. The patterned second photoresist layer 202 can further cover the surface of the interlayer dielectric layer 102 at the first region I, the surface of the first metal silicide layer 109, the surface of the interlayer dielectric layer 102 at the fourth region IV, and the surface of the second metal silicide layer 110.

Figure 21:
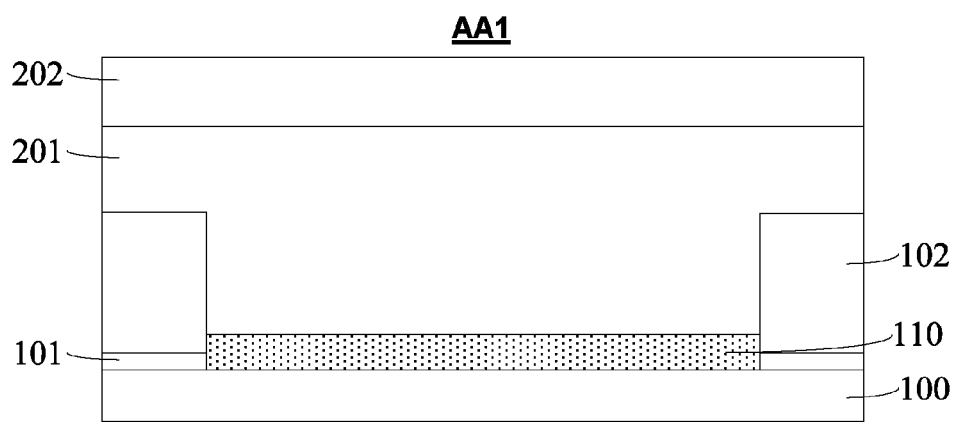
Figure 22A:
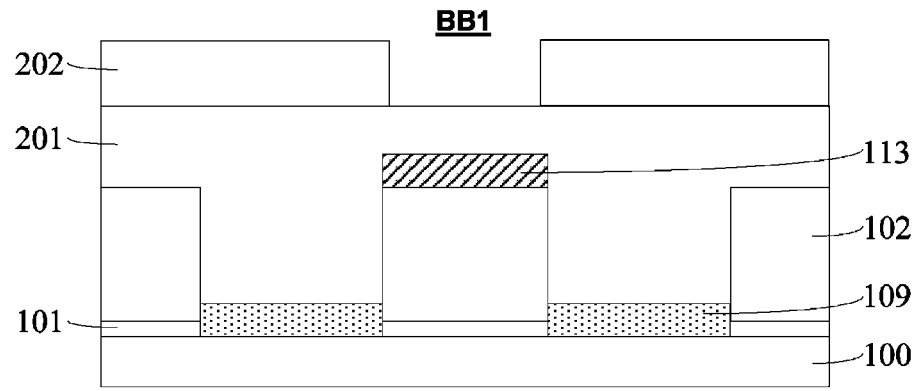
Figure 23:
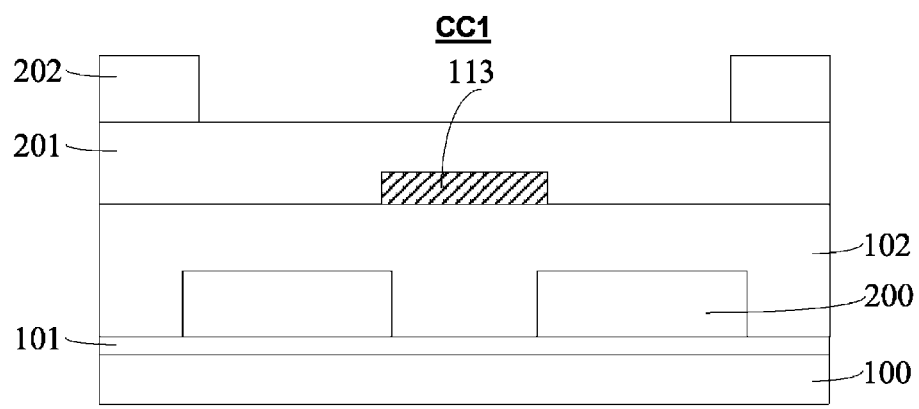

FIGS. 21, 22A and 23 depict a corresponding structure. FIG. 21 depicts the corresponding structure based on FIG. 16. That is, FIG. 21 depicts a cross-sectional view of the structure in FIG. 16 after Steps S107-S108 are performed. FIG. 22A depicts the corresponding structure based on FIG. 19. That is, FIG. 22A depicts a cross-sectional view of the structure in FIG. 19 after Step S108 is performed. FIG. 23 depicts the corresponding structure based on FIG. 20. That is, FIG. 23 depicts a cross-sectional view of the structure in FIG. 20 after Step S108 is performed.

Requirements for position of the second photoresist layer 202 can be as follows. The second photoresist layer 202 can cover a portion of the second region II, expose a position corresponding to the gate structure 200 at the second region II, and expose a position corresponding to the remaining mask. The second photoresist layer 202 and the remaining mask layer can subsequently be used as a mask to etch the second region II to form the second contact via. The second contact via can expose the top of the gate structure 200. The second photoresist layer 202 can cover the fourth region IV and the first region I, to protect the interlayer dielectric layer 102 at the first region I and at the fourth region IV from being damaged by a subsequent process for forming the second contact via.

Figure 22B:
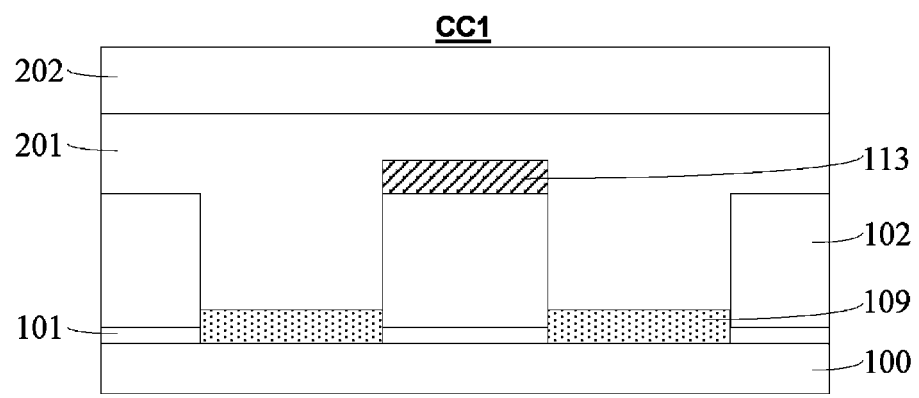

In one embodiment, as shown in FIG. 22A, the second photoresist layer 202 can substantially expose the third region III entirely, such that the mask layer can be used as a mask during a subsequent third etching process. However, in certain other embodiments, the second photoresist layer 202 does not need to expose the third region III entirely. Instead, the second photoresist layer 202 can cover a portion of the third region III. For example, the second photoresist layer 202 can cover a center portion of the third region III and expose portions corresponding to edges of the mask layer at the boundary between the third region III and the second region II. Thus, in this case, the mask layer can still be used as a mask during the subsequent third etching process. For illustrative purposes, as shown in FIG. 22B, the second photoresist layer 202 can extend across the third region III in the CC1 direction as indicated in FIG. 18, to connect the second photoresist layer 202 that covers the first region I at both sides of the third region III.

A process and material(s) for forming the second anti-reflective coating 201 and the second photoresist layer 202 can be the same as or similar to the process and the material(s) for forming the first anti-reflective coating 105 (referring to FIG. 10) and the first photoresist layer 106 (referring to FIG. 10).

Figure 24:
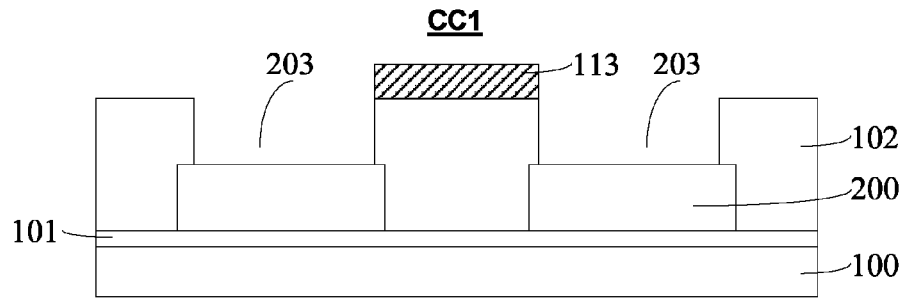

In Step S109 of FIG. 29, using the second photoresist layer 202 (referring to FIG. 23) and the first mask layer 113 as a mask and using a third etching process, the interlayer dielectric layer 102 at the second region II at both sides of the first mask layer 113 is etched, until the top of the gate structure 200 is exposed. The second contact via 203 can thus be formed in the interlayer dielectric layer 102 at the second region II. FIG. 24 depicts a corresponding structure. FIG. 24 depicts the corresponding structure based on FIG. 23. That is, FIG. 24 depicts a cross-sectional view of the structure in FIG. 23 after Step S109 is performed.

In one embodiment, because the second anti-reflective coating 201 (referring to FIG. 23) is formed, the following process can be performed before the interlayer dielectric layer 102 at the second region II is etched. That is, the second anti-reflective coating 201 that is not covered by the second photoresist layer 202 can be removed by etching.

The third etching process can include dry etching. Because $CH_2F_2$ gas can have a high etching rate on the interlayer dielectric layer 102 and a low etching rate on the first mask layer 113, the third etching process can have an etching gas including $CH_2F_2$.

In one embodiment, the third etching process can include plasma etching. For example, the plasma etching can include the following process parameters. The plasma etching can have an etching gas including $CH_2F_2$ and Ar, a flow rate of the $CH_2F_2$ etching gas ranging from about 10 sccm to about 300 sccm, an Ar flow rate ranging from about 10 sccm to about 50 sccm, an etching chamber pressure ranging from about 10 mTorr to about 50 mTorr, a source power ranging from about 500 watts to about 2000 watts, and a bias power ranging from about 1000 watts to about 2000 watts.

During the third etching process, the second photoresist layer 202 at the first region I and the fourth region IV can protect the interlayer dielectric layer 102 from being damaged by the third etching process.

In one embodiment, the third etching process can use the first mask layer 113 and the second photoresist layer 202 as an etching mask. The first mask layer 113 can be formed by removing a thickness portion of the mask layer. That is, the first mask layer 113 can be retained after the thickness portion of the mask layer is removed. Thus, the first mask layer 113 can have the same position as the mask layer having the two-layer, in order to prevent the position of the second contact via from deviating from the designed target (or designed position). Further, process steps for forming the mask layer can be reduced, process steps can be simplified, and thus production efficiency can be improved.

In contrast, in conventional technology, after a first contact via is formed, the mask layer for forming the first contact via is completely removed. Before the second contact via is formed, a mask layer is formed again. Thus, a process for forming an interconnect structure is often more complicated and production efficiency is often low. Further, the mask layer is formed by photolithography and etching processes, and the photolithography and etching processes is likely to cause the position of the mask layer to deviate. As a result, the formed second contact via can deviate from the design target. Reliability and electrical performance of the interconnect structure can be affected.

Still referring to Step S108 of FIG. 29, after the second contact via 203 is formed, the second photoresist layer 202 and the second anti-reflective coating 201 can be removed. In one embodiment, the second photoresist layer 202 and the second anti-reflective coating 201 can be removed using an ashing process.

Figure 25:
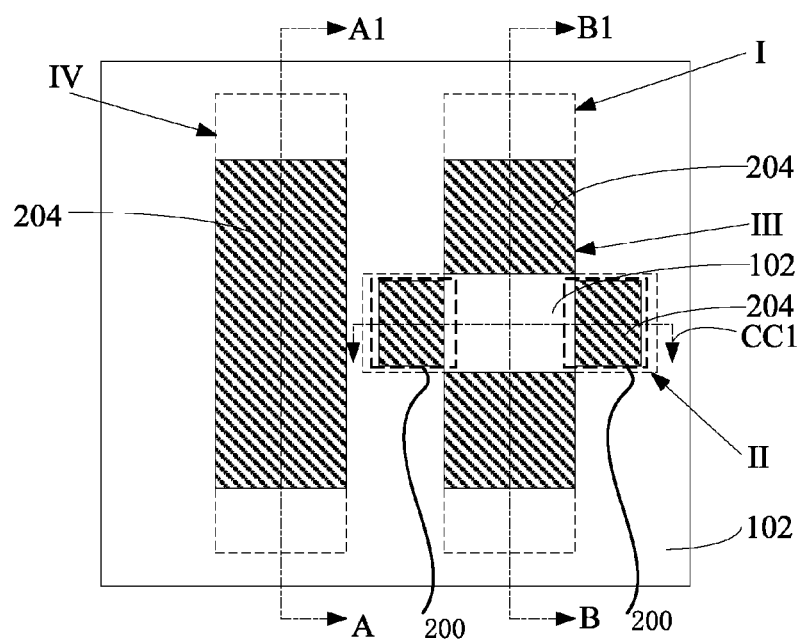
Figure 26:
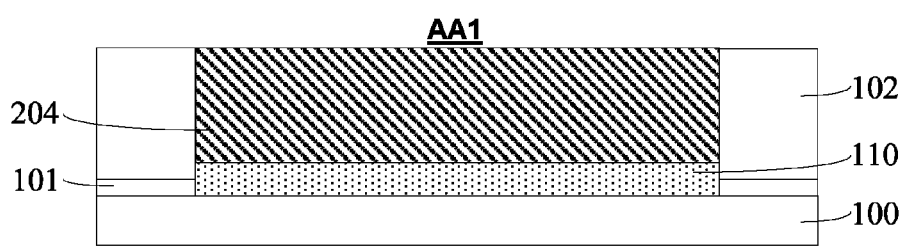
Figure 27:
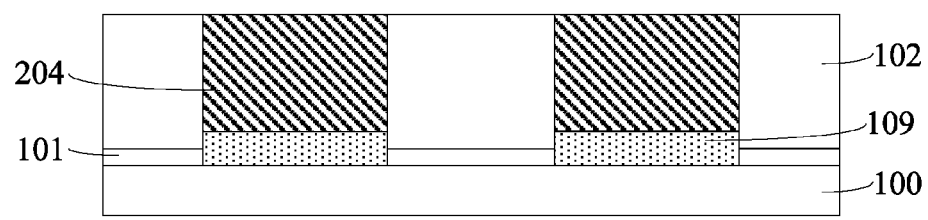

In Step S110 of FIG. 29, a conductive layer 204 is formed to substantially fill the first contact via 108 (referring to FIG. 17) and the second contact via 203 (referring to FIG. 24). FIGS. 25-28 depict a corresponding structure. FIG. 25 depicts a top view of the structure. FIG. 26 depicts a cross-sectional view of the structure in an AA1 direction in FIG. 25. FIG. 27 depicts a cross-sectional view of the structure in a BB1 direction in FIG. 25. FIG. 28 depicts a cross-sectional view of the structure in a CC1 direction in FIG. 25.

In one embodiment, at the same time of forming the conductive layer 204 by filling the first contact via 108 and the second contact via 203, the conductive layer 204 can further substantially fill the third contact via 107 (referring to FIG. 16).

A process for forming the conductive layer 204 can include the following exemplary steps. A conductive film filling the first contact via 108, the second contact via 203 and the third contact via 107 can be formed. The conductive film can be further located on the surface of the interlayer dielectric layer 102 and the surface of the first mask layer 113 (referring to FIG. 24). The conductive film higher than the top of the interlayer dielectric layer 102 can be removed using a chemical mechanical polishing (CMP) process, to form the conductive layer 204.

In one embodiment, at the same time of forming the conductive layer 204, the first mask layer 113 can be removed, to further simplify the process steps and save production cost.

The conductive layer 204 can have a single-layer structure or a multi-layer structure. When the conductive layer 204 has a single-layer structure, the conductive layer 204 can include a metal bulk layer filling the first contact via 108, the second contact via 203 and the third contact via 107. When the conductive layer 204 has a multi-layer structure, the conductive layer 204 can include a metal barrier layer located on the bottom and sidewall(s) of each of the first contact via 108, the second contact via 203 and the third contact via 107. In that case, the conductive layer 204 can further include a metal bulk layer on the surface of the metal barrier layer.

For illustrative purposes, in one embodiment, the conductive layer 204 can have a multi-layer structure. The metal barrier layer can prevent metal ions in the metal bulk layer from diffusing into the interlayer dielectric layer 102 and causing contamination, and thus can improve performance of the interconnect structure. Further, the metal barrier layer can provide a desired interface state for the forming of the metal bulk layer, such that the formed metal bulk layer and the metal barrier layer can have relatively high adhesion therebetween.

The metal barrier layer can be made of a material including Ti, Ta, W, TiN, TaN, TiSiN, TaSiN, WN, WC, or a combination thereof. The metal barrier layer can have a single-layer structure or a multi-layer structure. The metal bulk layer can be made of a material including W, Cu, Al, Ag, Pt, or any alloy material containing one or more of the above metals. The metal bulk layer can have a single-layer structure or a multi-layer structure.

The process for forming the metal barrier layer may include chemical vapor deposition, physical vapor deposition, atomic layer deposition, and/or the like.

In one embodiment, the metal barrier layer can be made of a material including Ta. The metal barrier layer can have a thickness ranging from about 10 Å to about 500 Å. The metal barrier layer can be formed using a physical vapor deposition process. The metal bulk layer can be made of a material including W. The metal bulk layer can be formed by electroplating.

In other embodiments, when the gate conductive layer in the gate structure 200 is made of a material including polysilicon, before the conductive layer 204 is formed, a third metal silicide layer can be formed on the bottom of the second contact via 203, to further reduce the contact resistance of the interconnect structure.

It should be noted that, in other embodiments of the present disclosure, the first mask layer 113 can be removed first, and the conductive film filling the first contact via 108, the second contact via 203 and the third contact via 107 can then be formed. For example, the first mask layer 113 can be removed using a wet etching process. The wet etching process can have an etching liquid including a phosphoric acid solution. A conductive film filling the first contact via 108, the second contact via 203 and the third contact via 107 can then be formed. The conductive film can be further located on the surface of the interlayer dielectric layer 102. The conductive film higher than the top of the interlayer dielectric layer 102 can be removed using a CMP process, to form the conductive layer 204 filling the first contact via 108, the second contact via 203 and the third contact via 107.

In some embodiments, for illustrative purposes, the base can have a first region I, a second region II, and a fourth region IV. Further, the first region I and the second region II can have an overlapped third region III.

In other embodiments of the present disclosure, the base can have 2, 3 or more first regions for forming first contact via(s) of the same height (or depth). The base can have 2, 3 or more fourth regions for forming third contact via(s) of the same height (or depth). The height (or depth) of the first contact via(s) can be substantially the same as the height (or depth) of the third contact via(s). The base can have 2, 3 or more second regions for forming second contact via(s) of the same height (or depth). The height (or depth) of the second contact via(s) can be less than the height (or depth) of the first contact via(s). Further, the first region(s) I and the second region(s) II can have one or more overlapped third regions III. In that case, the interconnect structure having multiple first regions I, second regions II, and fourth regions IV can be formed using the methods provided in FIGS. 1-29.

As such, the methods as disclosed herein can have the following advantages. First, a base having a first region and a second region is provided. The base can include a substrate and an interlayer dielectric layer. The base has a first region and a second region. A gate structure can be formed in the interlayer dielectric layer at the second region. The first region and the second region can have an overlapped third region. A mask layer having a stacked structure can be formed on the surface at the third region. By using the mask layer as an etching mask, the interlayer dielectric layer located at the first region on both sides of the mask layer can be etched, to form a first contact via. The first contact via can expose the surface of the substrate. After a metal layer is formed on a bottom and sidewall(s) of the first contact via, a silicidation process can be performed on the metal layer to form a first metal silicide layer. The metal layer that has not had the silicidation reaction can be removed, and a thickness portion of the mask layer can be removed. By using the remaining mask layer as a mask, the interlayer dielectric layer at the second region at both sides of the mask layer can be etched, until the top of the gate structure is exposed, to form the second contact via. Thus, steps for forming a mask layer in order to form the second contact via can be eliminated. Process steps can be simplified, and production efficiency of the interconnect structure can be improved.

Further, because the mask layer for forming the second contact via can have the same position as the mask layer for forming the first contact via, the position deviation resulted from forming the mask layer using photolithography followed by etching can thus be prevented. Position accuracy of the formed second contact via can be improved. Thus, reliability and electrical performance of the formed interconnect structure can be improved.

As a result of the position accuracy that may be achieved by the disclosed methods, according to certain embodiments, a top view of a device formed by the disclosed method can be as shown in FIG. 25. In FIG. 25, the overlapped third region III of the first region I and the second region II can be a rectangular region exposing a portion of the interlayer dielectric layer 102. The rectangular region can have two pairs of parallel sides. A first pair of parallel sides is in the first region I and immediately adjacent to the first contact vias. A second pair of parallel sides is in the second region II and immediately adjacent to the second contact vias. At least one vertex of the rectangular region can substantially be a common vertex shared by both of a first contact via and a second contact via.

In other words, according to the disclosed methods, one mask layer can be formed. Subsequently, during a first patterning-etching step, the mask layer can be combined with a first patterned photoresist to form an etch mask, to form first contact vias. Next, during a first patterning-etching step, the mask layer can be combined with a second patterned photoresist to form an etch mask, to form second contact vias. The first contact vias and second contact vias can be immediately adjacent (or next) to the third region III, and substantially completely enclose the third region III as shown in FIG. 25. Or alternatively, the first contact vias and second contact vias can be immediately adjacent (or next) to the third region III, and partially enclose the third region III.

Still further, the mask layer can include a stacked structure having a first mask layer and a second mask layer on the surface of the first mask layer. The first mask layer can be made of a material including SiN. The second mask layer can be made of a material including TiN and/or TaN. The second etching process can have a high etching rate for the second mask layer and a low etching rate for the first mask layer. Therefore, the second etching process can have a great etching selectivity on the first mask layer and the second mask layer, such that the mask layer can be prevented from being completely removed by the second etching process. In addition, the second etching process can have an obvious etch stop position, so process difficulty of forming the interconnection structure can be further reduced.

Moreover, according to various embodiments of the present disclosure, the first contact via can be formed using the mask layer and a first photoresist layer as an etching mask. The first photoresist layer can cover a region of the first region that does not need to form the first contact via. Thus, the width of the formed first contact via can meet different process requirements. Similarly, by forming a second photoresist layer, as disclosed herein, the width of the formed second contact via can also meet different process requirements.

Various embodiments further provide a semiconductor device. The semiconductor device has an interconnect structure. Referring to FIGS. 25-28, an exemplary semiconductor device includes a substrate 100 and an interlayer dielectric layer 102 on the substrate. The base has a first region I and a second region II. The first region I and the second region II can have an overlapped third region III. The substrate can further include a fourth region IV. The interlayer dielectric layer 102 at the second region II can have a gate structure 200 therein. The substrate 100 at the first region I can have a source region and a drain region formed therein. The substrate 100 and the interlayer dielectric layer 102 can have an etch stop layer 101 therebetween.

As shown in FIG. 27, the interlayer dielectric layer 102 at the first region I can have first contact via(s). The first contact via can pass through the interlayer dielectric layer 102. A bottom of the first contact via exposes the surface of the source region or the drain region. A first metal silicide layer 109 can be formed at the bottom of the first contact via.

As shown in FIG. 28, the interlayer dielectric layer 102 at the second region II can have second contact via(s). The second contact via can pass through the interlayer dielectric layer 102, such that a bottom of the second contact via can expose the top of the gate structure 200.

As shown in FIG. 26, the interlayer dielectric layer 102 at the fourth region IV can have third contact via(s). The third contact via can pass through the interlayer dielectric layer 102. A bottom of the third contact via can expose the surface of the substrate 100. A second metal silicide layer 110 can be formed at the bottom of the third contact via.

Further, the interconnect structure can include a conductive layer 204 substantially filling the first contact via, the second contact via, and the third contact via.

In certain embodiments, an exemplary method for forming a local interconnect structure is disclosed. A substrate is provided. The substrate can be made of silicon. An etch stop layer can be formed on the substrate. An interlayer dielectric layer can be formed on the etch stop layer. A gate structure can be formed in the interlayer dielectric layer. The substrate has a first region and a second region. The first region and the second region have an overlapped third region.

Further, a mask layer, i.e., a 'cut mask' can be formed at the third region III. The mask layer can have a stacked structure including a SiN layer (hard mask 2) and a metal layer (hard mask 1) on the SiN layer.

A first anti-reflective coating can be formed on the mask layer and the interlayer dielectric layer. A first photoresist layer can be formed on first anti-reflective coating to expose position corresponding to the mask layer and a portion of the first region. An 'MOF pattern transfer' can be performed using the first photoresist layer and the mask layer as an etching mask, to etch through both of the interlayer dielectric layer and the etch stop layer, to form a first contact via.

Further, a first metal layer can be formed on the bottom and sidewalls of the first contact via. The first metal layer can be made of a material including Ti or Ni. An annealing process can be performed to form Ti-silicide or Ni-silicide on the bottom of the first contact via. A wet cleaning process can be used to remove the remaining Ti or Ni and the hard mask 1 of the mask layer.

A second anti-reflective coating can be formed on the mask layer and the interlayer dielectric layer. A second photoresist layer can be formed on second anti-reflective coating to expose the mask layer and a portion of the second region. An 'MUG pattern transfer' can be performed using the second photoresist layer and the hard mask 2 as an etching mask. The interlayer dielectric layer can be etched through to form a second contact via. The second contact via can expose the top of the gate structure.

Optionally, the substrate can further include a fourth region. The first photoresist layer can be formed on the first anti-reflective coating to expose position corresponding to a portion of the fourth region. Using the first photoresist layer as an etching mask, the interlayer dielectric layer and the etch stop layer can be etched through to form a third contact via at the fourth region IV. The first metal layer can be formed on the bottom and sidewalls of the third contact via, and Ti-silicide or Ni-silicide can be form on the bottom of the third contact via.

In one embodiment, the substrate can have source/drain regions of a FinFET formed therein.

In one embodiment, the patterning of the first photoresist layer to be an etching mask and/or patterning of the second photoresist layer to be an etching mask can include photolithography followed by etching, nano-imprint lithography, nano-injection lithography (NIL), or a combination thereof.

In one embodiment, one or both of the hard mask 1 and the hard mask 2 can be made of a material including polysilicon, a dielectric material, a metal, or a combination thereof. The material of the hard mask 1 may be the same as or different from the material of the hard mask 2. In one example, the hard mask 1 can be made a metallic material, e.g., TiN or TaN. In this case, the hard mask 2 can be made of SiN.

In one embodiment, during the MOF pattern transfer, the etching process can have a high selectivity for the hard mask 1, such that the hard mask 1 can be used as an etching mask. Main etching chemistry of the etching process can be based on $C_4F_8$, $C_5F_8$, and/or $CH_2F_2$.

In one embodiment, during the MOG pattern transfer, the etching process can have a high selectivity for the hard mask 2, such that the hard mask 2 can be used as an etching mask. Main etching chemistry of the etching process can be based on $CH_2F_2$.

As used herein, relational terms such as 'first' and 'second' are merely used for differentiate one element or operation from another element or operation, and do not require or imply that any actual relationship or order as such exist between these elements or operations. In addition, the terms "include", "comprise", "contain", or any other variations thereof, are intended to cover a non-exclusive inclusion, such that a process, method, article, or apparatus that includes a series of elements can not only include those elements, but also include other elements not expressly listed, or inherent elements for such a process, method, article, or apparatus. Without further limitation, an element defined by a statement "include one" does not exclude additional identical elements that may be included in the process, method, article, or apparatus that includes the element.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming an interconnect structure, comprising:
   providing a base including a substrate and an interlayer dielectric layer, wherein the base has a first region and a second region, the first region and the second region have an overlapped third region, and the interlayer dielectric layer at the second region has a gate structure formed therein;
   forming a mask layer on the interlayer dielectric layer on the overlapped third region, the mask layer having a stacked structure;
   using the mask layer as an etching mask, etching the interlayer dielectric layer located at the first region at both sides of the mask layer, such that a surface of the substrate is exposed and a first contact via is formed on the exposed surface of the substrate and in the interlayer dielectric layer at the first region;
   using the mask layer as the etching mask, etching the interlayer dielectric layer at the second region at both sides of the mask layer, such that a top of the gate structure is exposed, to form a second contact via in the interlayer dielectric layer at the second region, wherein the mask layer is used as an etching mask for forming both of the first contact via and the second contact via; and
   forming a conductive layer filling the first contact via and the second contact via.

2. The method according to claim 1, wherein:
   during the forming of the first contact via, etching the interlayer dielectric layer using a first etching process;
   after forming the first contact via, the method further includes: forming a metal layer on a bottom and a sidewall of the first contact via;
   performing a silicidation process on the metal layer, to form a first metal silicide layer on the bottom of the first contact via; and
   using a second etching process, removing a portion of the metal layer that is not silicided, and removing a thickness portion of the mask layer at a same time; and
   during the forming of the second contact via, etching the interlayer dielectric layer using a third etching process.

3. The method according to claim 2, wherein the stacked structure is a two-layer structure, and the mask layer includes a first mask layer and a second mask layer on the first mask layer.

4. The method according to claim 3, wherein the removing of the thickness portion of the mask layer includes removing the second mask layer.

5. The method according to claim 3, wherein each of the first mask layer and the second mask material layer is made of a material including TiN, TaN, SiN, or a combination thereof.

6. The method according to claim 3, wherein:
   the first mask layer is made of a material including SiN; and
   the second mask material layer is made of a material including TiN, TaN, or a combination thereof.

7. The method according to claim 2, wherein:
   the first etching process has an etching gas including $C_4F_8$, $C_5F_8$, $CH_2F_2$, or a combination thereof;
   the second etching process includes wet etching that has an etching liquid including a hydrofluoric acid solution; and
   the third etching process has an etching gas including $CH_2F_2$.

8. The method according to claim 2, wherein the first metal silicide layer is made of a material including NiSi, TiSi, TaSi, or a combination thereof.

9. The method according to claim 2, wherein, before using the first etching process, the method further includes:
   sequentially forming a first anti-reflective coating and a patterned first photoresist layer on both of the interlayer dielectric layer and the mask layer at the first region, wherein the first anti-reflective coating covers the interlayer dielectric layer at the second region.

10. The method according to claim 9, wherein the first etching process uses the first photoresist layer and the mask layer as an etching mask.

11. The method according to claim 2, wherein, before using the third etching process, the method further includes:
    sequentially forming a second anti-reflective coating and a patterned second photoresist layer on both of the interlayer dielectric layer and the mask layer at the second region, wherein the second anti-reflective coating covers the interlayer dielectric layer at the first region.

12. The method according to claim 11, wherein the third etching process uses the second photoresist layer and the mask layer as an etching mask.

13. The method according to claim 9, wherein the base further includes a fourth region, and the method further includes:
    sequentially forming the first anti-reflective coating and the patterned first photoresist layer on the interlayer dielectric layer at the fourth region;
    at a same time of forming the first contact via, by using the first photoresist layer as an etching mask and using the first etching process, etching the interlayer dielectric layer at the fourth region, such that the surface of the substrate is exposed, to form the third contact via; and
    at a same time of forming the first metal silicide layer on the bottom of the first contact via, forming a second metal silicide layer on a bottom of the third contact via.

14. The method according to claim 13, wherein: at a same time of forming the conductive layer filling the first contact via and the second contact via, the conductive layer further fills the third contact via.

15. The method according to claim 2, wherein:
    the conductive layer has a single-layer structure or a multi-layer structure;
    when the conductive layer has a single-layer structure, the conductive layer includes a metal bulk layer;

when the conductive layer has a multi-layer structure, the conductive layer includes a metal barrier layer and a metal bulk layer on a surface of the metal barrier layer; and the metal bulk layer is made of a material including W, Cu, Al, Ag, Pt, or an alloy containing at least one metal thereof.

16. The method according to claim 2, wherein the substrate in the first region has a source region and a drain region formed therein, and the first contact via exposes a surface of the source region and the drain region.

17. The method according to claim 2, wherein the substrate and the interlayer dielectric layer have an etch stop layer therebetween.

* * * * *